(12) United States Patent
Witkowski et al.

(10) Patent No.: US 8,000,667 B2
(45) Date of Patent: Aug. 16, 2011

(54) SYSTEM AND METHOD FOR COMPENSATING FOR MODULATION INDUCED FREQUENCY SHIFT DURING TRANSMISSION OF A RADIO FREQUENCY SIGNAL

(75) Inventors: Todd R. Witkowski, Zeeland, MI (US); Jason L. Reene, Holland, MI (US)

(73) Assignee: Johnson Controls Technology Company, Holland, MI (US)

( * ) Notice: Subject to any disclaimer, the term of this patent is extended or adjusted under 35 U.S.C. 154(b) by 661 days.

(21) Appl. No.: 11/346,991

(22) Filed: Feb. 3, 2006

(65) Prior Publication Data

US 2007/0197172 A1    Aug. 23, 2007

(51) Int. Cl.
 *H04B 1/16* (2006.01)
 *H04M 1/00* (2006.01)
 *H04B 7/00* (2006.01)
 *H04B 5/00* (2006.01)

(52) U.S. Cl. ..... 455/208; 455/41.1; 455/41.2; 455/41.3; 455/569.2

(58) Field of Classification Search ............ 455/41.1, 455/41.2, 41.3, 569.2, 208
See application file for complete search history.

(56) References Cited

U.S. PATENT DOCUMENTS

| | | | |
|---|---|---|---|
| 4,587,498 A * | 5/1986 | Bonnerot et al. | 375/344 |
| 5,390,216 A * | 2/1995 | Bilitza et al. | 375/354 |
| 5,661,804 A | 8/1997 | Dykema et al. | |
| 6,091,343 A * | 7/2000 | Dykema et al. | 340/825.69 |
| 6,268,780 B1 * | 7/2001 | Olgaard et al. | 332/117 |
| 6,397,186 B1 * | 5/2002 | Bush et al. | 704/274 |
| 6,603,821 B1 * | 8/2003 | Doi | 375/326 |

FOREIGN PATENT DOCUMENTS

DE    3912814 C1    7/1990
WO    WO 02/075927 A2    9/2002

OTHER PUBLICATIONS

European Office Action for Application No. 07763536.5, dated Feb. 17, 2009, 3 pages.
International Search Report and Written Opinion for International Patent Application No. PCT/US2007/002833, mailed Jul. 25, 2007, 23 pages.

* cited by examiner

*Primary Examiner* — Wen Huang
(74) *Attorney, Agent, or Firm* — Foley & Lardner LLP

(57) ABSTRACT

A method for compensating for frequency shifts during transmission of an RF control signal includes receiving a request to enter a transmission mode from a user. A carrier signal having a frequency is generated and the frequency of the carrier signal is measured. The measured frequency of the carrier signal is compared to a desired frequency to determine if there is a difference between the measured frequency and the desired frequency. If there is a difference, it is determined if data is being modulated on the carrier signal. If data is not being modulated on the carrier signal, a correction is applied to the carrier signal frequency.

19 Claims, 3 Drawing Sheets

SYSTEM AND METHOD FOR COMPENSATING FOR MODULATION INDUCED FREQUENCY SHIFT DURING TRANSMISSION OF A RADIO FREQUENCY SIGNAL

FIELD OF THE INVENTION

The present invention relates generally to the field of electronic transmitters and transceivers for use with vehicles. More specifically, the present invention relates to electronic transceivers that are configured for use with remote control systems.

BACKGROUND

Electronically operated remote control systems, such as garage door opener systems, home security systems, home lighting systems, gate controllers, etc., typically employ a portable, hand-held transmitter (i.e., an original transmitter) to transmit a control signal to a receiver located at the remote control system. For example, a garage door opener system typically includes a receiver located within a home owner's garage and coupled to the garage door opener. A user presses a button on the original transmitter to transmit a radio frequency signal to the receiver to activate the garage door opener to open and close a garage door. Accordingly, the receiver is tuned to the frequency of its associated original transmitter and demodulates a predetermined code programmed into both the original transmitter and the receiver for operating the garage door. To enhance security of wireless control systems, such as a garage door opener system, manufacturers commonly use encryption technology to encrypt the radio frequency signal sent from a transmitter to a receiver. One example of such an encryption method is a rolling code system, wherein each digital message sent from the transmitter to the receiver has a different code from the previous digital message.

As an alternative to a portable, hand-held original transmitter, a trainable transmitter or transceiver may be provided in a vehicle for use with remote control systems. A trainable transmitter is configurable by a user to activate one or more of a plurality of different wireless control system receivers using different radio frequency messages. A user may train the trainable transmitter to an existing original transmitter by holding the two transmitters in close range and pressing buttons on the original transmitter and the trainable transmitter. The trainable transmitter identifies the type of remote control system associated with the original transmitter based on a radio frequency signal received from the original transmitter. For example, the trainable transmitter may identify and store the control code and carrier frequency of the original transmitter radio frequency ("RF") control signal. In addition, the receiver may learn a transmitter identifier of the trainable transmitter. For systems employing a rolling code (or other encryption method), the trainable transceiver and receiver must also be "synchronized" so that the counters of the trainable transmitter and the receiver begin at the same value. Accordingly, the user presses a button on the remote control system receiver to put the receiver in a training mode. A button on the trainable transceiver may then be pressed, for example, two to three times, to transmit messages so the receiver may learn the transmitter identifier, complete synchronization of the receiver and the trainable transmitter and confirm that training was successful. Once trained, the trainable transceiver may be used to transmit RF signals to control the remote control system.

In a transmission mode, a user presses an input device, e.g., a button, of the trainable transmitter that has been trained to a particular remote control system, for example, a garage door opener. In response to the user input, the trainable transmitter retrieves the frequency and control data associated with the button pressed, generates a carrier signal with the appropriate carrier frequency and modulates control data on the carrier signal to generate an RF control signal to control the garage door opener. The RF control signal is then transmitted to the garage door opener. During transmission of an RF signal, however, various RF characteristics of the trainable transmitter circuitry (e.g., RF characteristics of an Application Specific Integrated Circuit (ASIC) used for the RF circuitry) may cause the frequency of the carrier signal to be shifted. For example, RF characteristics may cause a frequency shift during periods when data is modulated on the RF carrier signal. The frequency shift results in a wider bandwidth of the transmitted RF control signal. The receiving bandwidth of a receiver associated with a remote control system, however, may be relatively narrow. Therefore, the wider bandwidth of the RF control signal caused by a shift in carrier frequency may adversely affect performance of the transmitter and the ability of a remote control system receiver to receive and respond to the RF control signal transmitted by the transmitter.

It should be understood that although an electronic transmitter may be described herein with reference to systems for trainable transmitters or rolling code transmitters, one or more of the systems and methods for compensating for frequency shifting may be applied to, and find utility in, other types of transmitters as well. For example, one or more of the systems for compensating for frequency shifting may be suitable for use with fixed code transmitters, single frequency transmitters, etc., all of which may require some form of compensation for frequency shifting.

Accordingly, there is a need for a system and method to compensate for frequency shifts during transmission of an RF control signal. There is also a need for a system and method for compensating for frequency shifts caused when data is being modulated on an RF carrier signal.

SUMMARY

In accordance with an embodiment, a method for compensating for frequency shifts during transmission of an RF control signal includes receiving a request to enter a transmission mode from a user, generating a carrier signal having a frequency, measuring the frequency of the carrier signal, and comparing the measured frequency of the carrier signal to a desired frequency. The method includes determining if there is a difference between the measured frequency and the desired frequency, and if so, determining if data is being modulated on the carrier signal. The method further includes applying a correction to the carrier signal frequency if data is not being modulated on the carrier signal.

In accordance with another embodiment, an electronic control system for compensating for frequency shifting during transmission of a radio frequency control signal with a remote electronic device includes a transceiver for establishing a wireless communication link with the remote electronic device. The system also includes a voltage controlled oscillator circuit coupled to transceiver, such that the voltage controlled oscillator circuit is configured to generate a control signal, including a carrier frequency. The system further includes a control circuit coupled to the voltage controlled oscillator circuit, such that the control circuit is configured to measure the carrier frequency of the control signal generated by the voltage controlled oscillator circuit. The carrier frequency of the control signal is compared to a desired frequency of the remote electronic device, such that if a difference exists between the value of the carrier frequency and the desired frequency, the control circuit determines if data is being modulated onto the carrier frequency of the control signal.

DETAILED DESCRIPTION OF EXEMPLARY EMBODIMENTS

Figure 1:
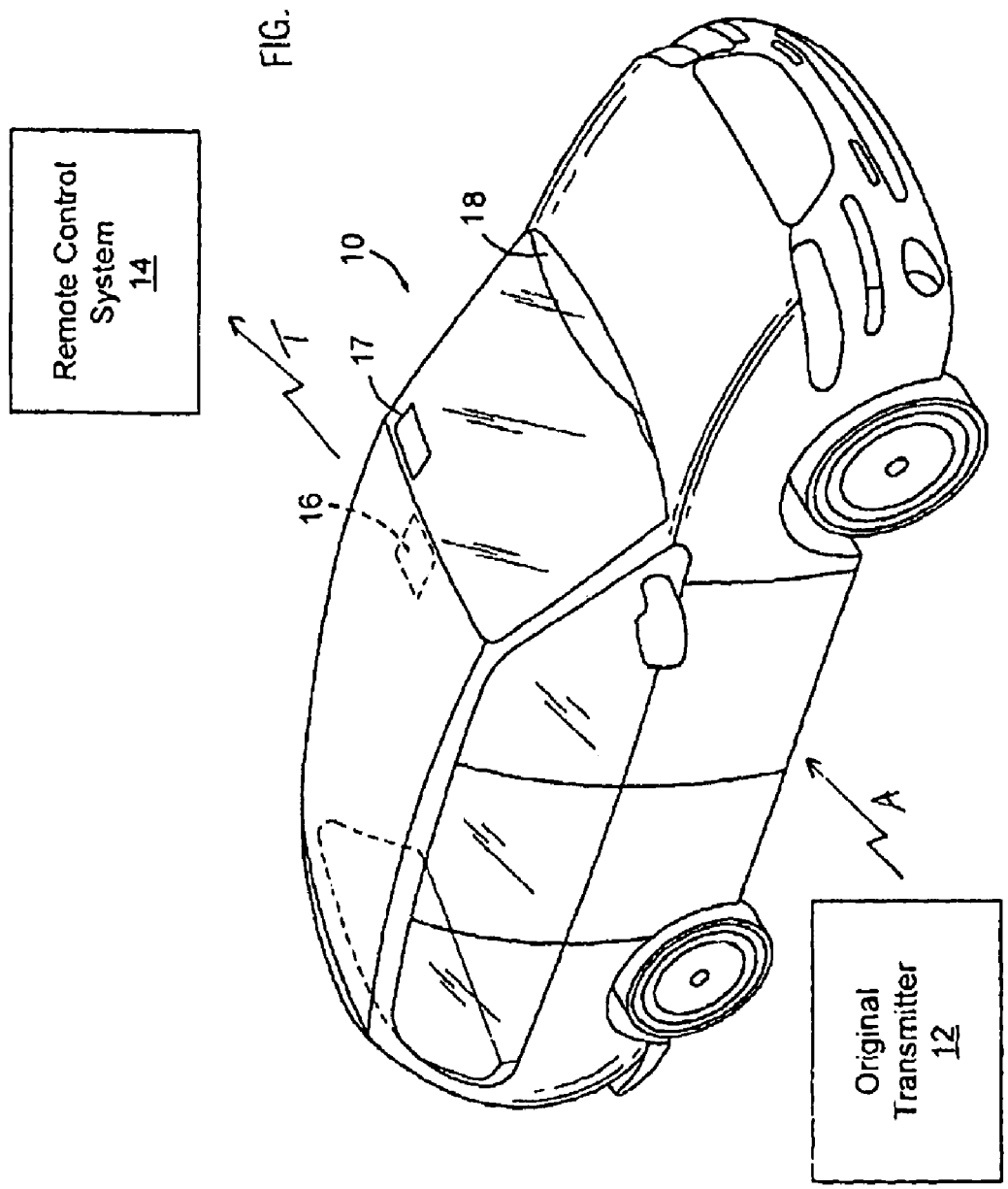
FIG. 1 is a perspective view of a vehicle having an electronic transmitter in accordance with an embodiment.

FIG. 1 is a perspective view of a vehicle including an electronic transmitter in accordance with an embodiment. A vehicle 10, which may be an automobile, truck, sport utility vehicle (SUV), mini-van, or other vehicle, includes an electronic transmitter 16. In alternative embodiments, an electronic transmitter may be embodied in other systems such as a portable housing, key fob, key chain or other hand-held device. In FIG. 1, electronic transmitter 16 is illustrated mounted to an overhead console of vehicle 10. Alternatively, one or more of the elements of electronic transmitter 16 may be mounted to other vehicle interior elements such as a visor 17, an instrument panel 18, a rearview mirror (not shown), a dashboard, seat, center console, door panel, or other appropriate location in the vehicle.

Electronic transmitter 16 may be configured to control a remote control system 14, such as a garage door opener, home security system, home lighting system, gate controller, etc. Electronic transmitter 16 is trained using an original transmitter 12 used to control remote control system 14. Original transmitter 12 is a transmitter, typically a hand-held transmitter, which is sold with remote control system 14 or as an after-market item, and which is configured to transmit an activation signal at a predetermined carrier frequency and having control data configured to actuate remote control system 14. For example, original transmitter 12 can be a hand-held garage door opener transmitter configured to transmit a garage door opener signal at a frequency, such as 355 Megahertz (MHz), wherein the activation signal has control data, which can be fixed code or cryptographically-encoded code (e.g., a rolling code). In this example, remote control system 14 may be a garage door opener system configured to open a garage door in response to receiving the activation signal from original transmitter 12. Accordingly, remote control system 14 includes an antenna (not shown) for receiving wireless signals including control data which would control remote control system 14.

To train electronic transmitter 16, an activation or control signal A is transmitted from original transmitter 12 to electronic transmitter 16 in the vehicle 10. Electronic transmitter 16 receives the control signal, identifies the control data (e.g., fixed or rolling code data) and carrier frequency of the control signal and stores this information for later retransmission. Electronic transmitter 16 may then be used to selectively generate and transmit a control signal T with the learned frequency and control data to the remote control system 14, such as a garage door opener, that is responsive to the control signal. The operation of electronic transmitter 16 is discussed in further detail below.

Figure 2:
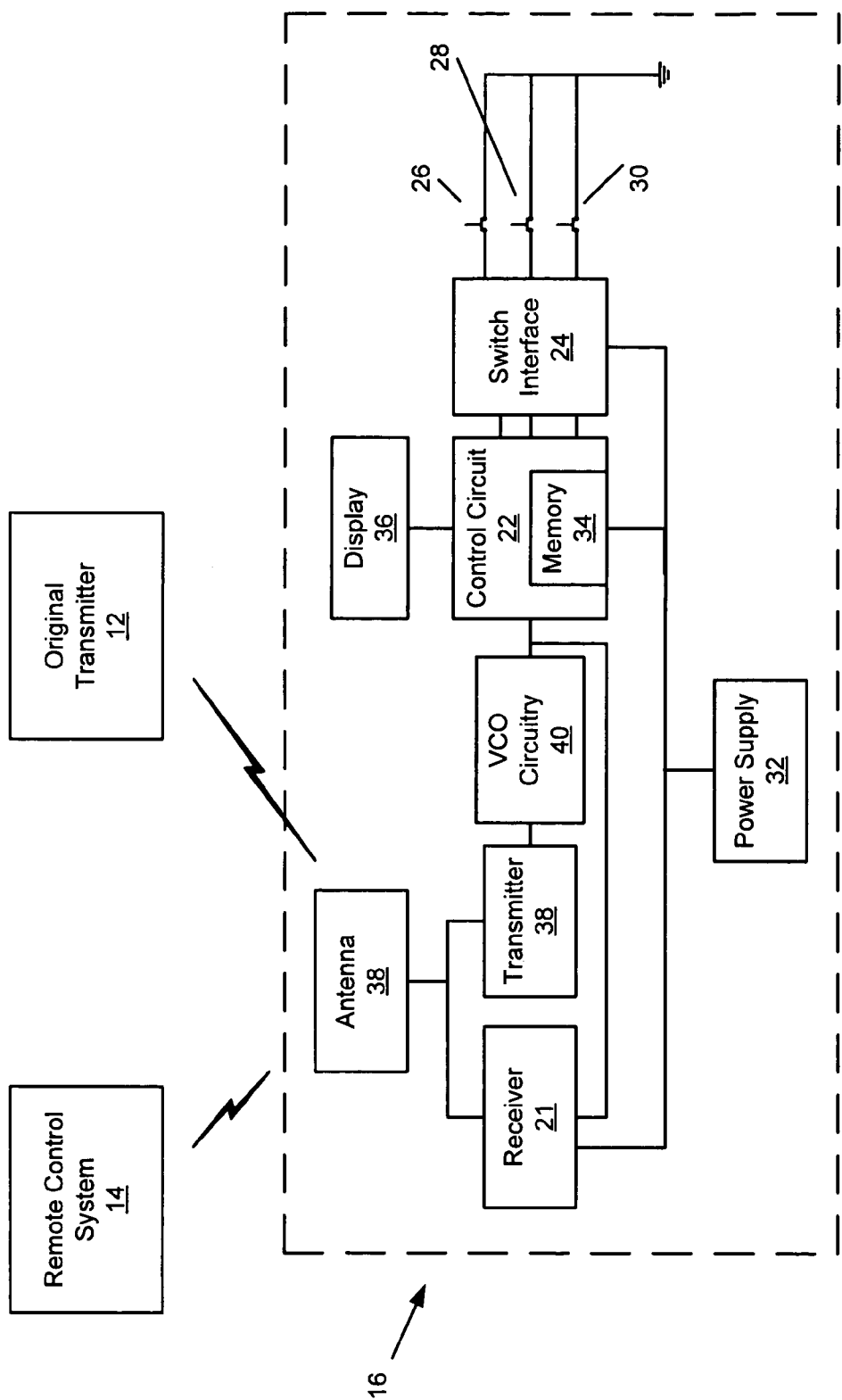
FIG. 2 is a schematic block diagram of an electronic transmitter in accordance with an embodiment.

FIG. 2 is a schematic block diagram of an electronic transmitter in accordance with an embodiment. Electronic transmitter 16 includes a transmitter circuit 20 and a receiver 21 that are coupled to an antenna 38. In another embodiment, a single dual function transceiver having transmit and receive circuitry may be provided in place of a separate receiver and transmitter. Transmitter circuit 20 and receiver 21 are also coupled to voltage controlled oscillator circuitry ("VCO") 40, hereinafter referred to as VCO circuitry 40, and control circuit 22. Control circuit 22 may include various types of control circuitry, digital and/or analog, and may include a microprocessor, microcontroller, application specific integrated circuit (ASIC), or other digital and/or analog circuitry configured to perform various input/output, control, analysis, and other functions to be described herein. VCO circuitry 40 is configured to generate a carrier signal at a specific frequency (e.g., the frequency identified or learned in a training mode) during training and transmission modes of the transmitter 16. During a transmission mode, the carrier signal generated by the VCO circuitry 40 is modulated with control data supplied by control circuit 22.

A switch interface 24 is coupled to a plurality of buttons or switches. Alternatively, other user input devices such as knobs, dials, etc., or a voice actuated input control circuit configured to receive voice signals from a vehicle occupant may be provided to receive user input. In an exemplary embodiment, switch interface 24 is coupled to one terminal of each of three push button switches 26, 28 and 30, which have their remaining terminal connected to ground. Switches 26, 28 and 30 may each be associated with a separate remote control system to be controlled, each of which may have its own unique operating RF frequency, modulation scheme, and/or control data. Thus, switches 26, 28 and 30 each correspond to a different radio frequency channel for transmitter circuit 20. It should be understood, however, that each channel may be trained to the same original transmitter, if desired, or to different original transmitters.

Switch interface 24 couples signal information from switches 26, 28 and 30 to the input terminals of control circuit 22. Control circuit 22 includes data input terminals for receiving signals from the switch interface 24 indicative of the closure states of switches 26, 28 and 30. A power supply 32 is conventionally coupled to the various components for supplying the necessary operating power in a conventional manner.

Control circuit 22 is also coupled to a display 36 which includes a display element such as a light emitting diode (LED). Display 36 may alternatively include other display elements, such as a liquid crystal display (LCD), a vacuum fluorescent display (VFD), or other display elements. Control circuit 22 includes a memory 34 including volatile and/or non-volatile memory to, for example, store a computer program or other software to perform the functions described herein. Memory 34 is configured to store learned information such as control data and carrier frequency information that may be associated with switches 26, 28 and 30. In addition, for rolling code or other cryptographically encoded remote control systems, information regarding the rolling code or cryptographic algorithms for each system may be pre-stored and associated with frequencies and control data that may be used to identify a particular type of remote control system and, therefore, the appropriate cryptographic algorithm for the remote control system. As discussed previously, each switch or button 26, 28 and 30 may be associated with a separate remote control system, such as different garage door openers, electronically operated access gates, house lighting controls and other remote control systems, each which may have its own unique operating RF frequency, modulation scheme and control data.

Transmitter circuit 20 and receiver 21 communicate with the remote control system 14 and the original transmitter 12 via antenna 38. Receiver 21 may be used to receive signals via antenna 38 and transmitter circuit 20 may be used to transmit signals via antenna 38. In an alternative embodiment, a separate antenna may be used with transmitter 20 and with receiver 21 (e.g., separate transmit and receive antennas may be provided in the electronic transmitter). Once a channel of electronic transmitter 16 has been trained, electronic transmitter 16 is configured to transmit a wireless control signal having control data that will control remote control system 14. For example, in response to actuation of a switch, such as switch 26, VCO circuitry 40 and transmitter circuit 20 are configured, under control from control circuit 22, to generate a control signal having a carrier frequency and control data associated with the particular trained channel. As mentioned above, VCO circuitry 40 generate a carrier signal at the selected frequency for the trained channel and then the control data is modulated on the carrier signal. The control data may be modulated onto the control signal using, for example, frequency shift key (FSK) modulation, amplitude shift key (ASK) modulation or other modulation technique. The control data on the control signal may be a fixed code or a rolling code or other cryptographically encoded control code suitable for use with remote control system 14. As mentioned previously, electronic transmitter 16 may learn the control code and carrier frequency for remote control system using original transmitter 12 for remote control system 14. The control signal may then be transmitted via antenna 38 to the remote control system 14.

During periods of time when data is modulated onto the carrier signal, the carrier frequency may be shifted from the desired frequency as a result of RF characteristics of the circuitry of the electronic transmitter 16. For example, RF components of electronic transmitter 16 may be implemented on an ASIC (application specific integrated circuit). RF characteristics of the ASIC may cause a frequency shift in the frequency of the carrier signal generated by VCO circuitry 40 (shown in FIG. 2) which can result in a wider bandwidth (e.g., the effective bandwidth) of the transmitted control signal.

Figure 3:
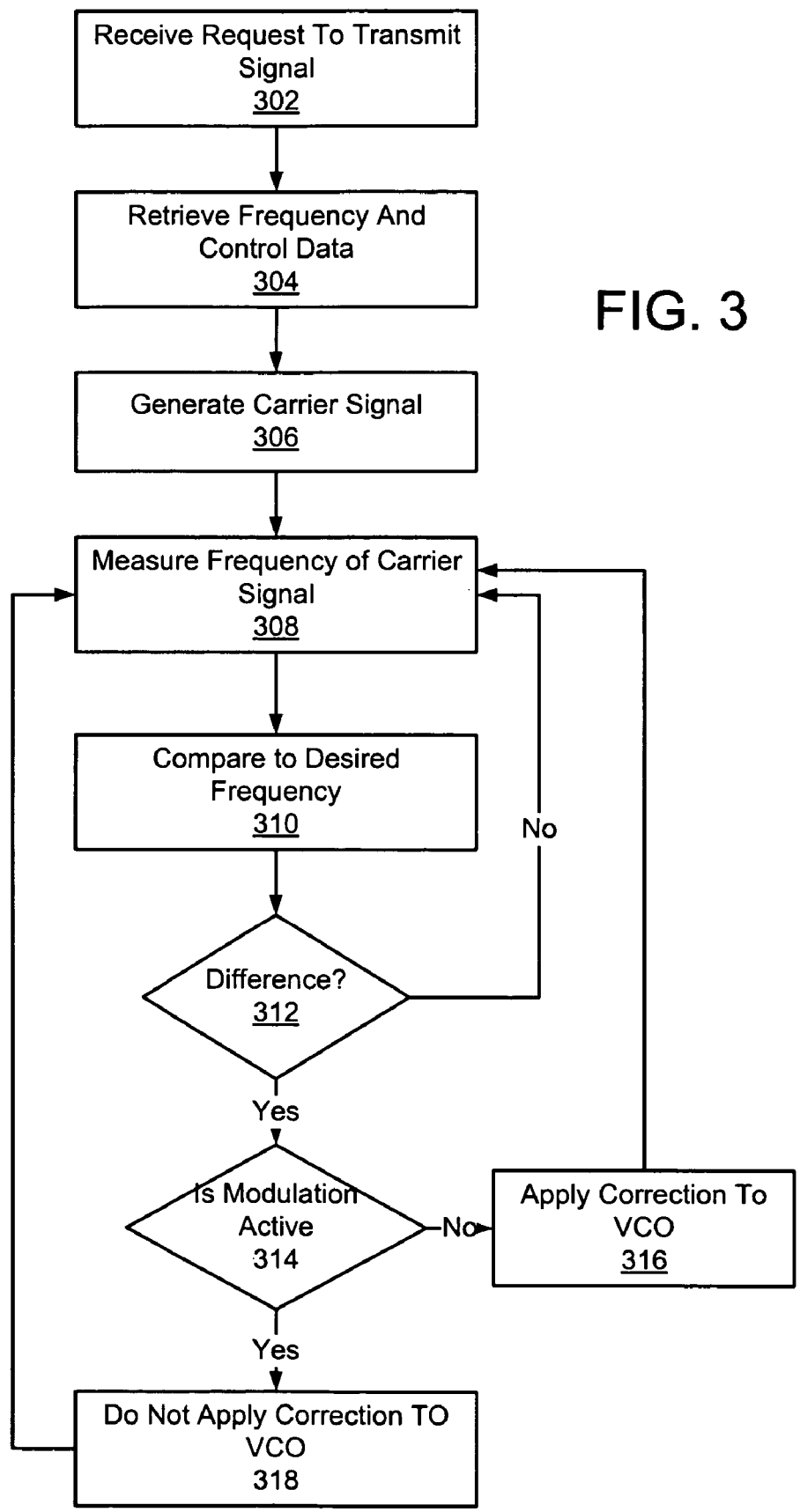
FIG. 3 illustrates a method for compensating for frequency shifts during transmission of an RF signal in accordance with an embodiment.

Referring now to FIG. 3, a method for compensating for frequency shifts during transmission of an RF signal is shown. At step 302, a request to transmit an RF control signal (e.g., to enter a transmission mode) is received from a user at the electronic transmitter 16. For example, a user may provide a request by actuating a pushbutton (e.g., pushbutton 26 shown in FIG. 2) of the electronic transmitter. A display may be used to indicate to the user that a transmission mode was initiated, for example, a display element such as an LED indicator may be lit or flash to provide feedback to the user. In alternative embodiments, a request to enter a transmission mode may be provided by a combination of key presses using input devices of the electronic transmitter, by receiving a message on a vehicle bus, or by selecting a menu item on a display, such as on a user interface.

At step 304, the frequency and control data associated with the user input (e.g., associated with the button pressed) is retrieved from memory. At step 306, a carrier signal is generated at the retrieved frequency by VCO circuitry 40 (shown in FIG. 2). At step 306, the frequency of the carrier signal is measured, for example, control circuit 22 (shown in FIG. 2) may be configured to measure the frequency of the carrier signal. The measured frequency is then compared to the desired frequency value in step 310 to determine if there is a difference. If there is not a difference, at step 312, the measurement and comparison steps are repeated for the duration of the signal transmission. If there is a difference at step 312, it is determined whether data is being modulated onto the carrier signal at step 314. If data is not being modulated, a correction factor (e.g., a correction pulse) is applied to the VCO circuitry 40 at step 316 to adjust the frequency of the carrier signal up or down as needed to keep the frequency as close to the desired frequency as possible. The measurement and comparison steps are repeated for the duration of the signal transmission. If data is being modulated onto the carrier signal, a correction is not applied to the VCO circuitry at step 318 and the measurement and comparison steps are repeated.

However, it should be understood that although the application of the correction factor is described herein with reference to systems wherein the data is not being modulated, one or more of the systems and methods for compensating for frequency shifting may be applied to, and find utility in, application of the correction factor when modulation is active, as well. For example, in other embodiments, a correction factor may be applied to the VCO circuitry 40 (at step 316) to adjust the frequency of the carrier signal when data is being modulated. If data is not being modulated onto the carrier signal, a correction factor is not be applied to the VCO circuitry (at step 318).

While the exemplary embodiments illustrated in the figures and described above are presently preferred, it should be understood that these embodiments are offered by way of example only. Describing the invention with figures should not be construed as imposing on the invention any limitations that may be present in the figures. The present invention contemplates methods, systems and program products on various alternative embodiments. For example, alternative embodiments may be suitable for use in the commercial market, wherein office lights or security systems or parking garage doors are controlled. Accordingly, the present invention is not limited to a particular embodiment, but extends to various modifications that nevertheless fall within the scope of the appended claims.

It should be noted that although the diagrams herein may show a specific order of method steps, it is understood that the order of these steps may differ from what is depicted. Also two or more steps may be performed concurrently or with partial concurrence. Such variation will depend on the embodiment of the control system and on designer choice. It is understood that all such variations are within the scope of the invention. Likewise, software implementations of the present invention could be accomplished with standard programming techniques with rule based logic and other logic to accomplish the various connection steps, processing steps, comparison steps and decision steps.

The foregoing description of embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principals of the invention and its practical application to enable one skilled in the art to utilize the invention in various embodiments and with various modifications as are suited to the particular use contemplated.

What is claimed is:

1. A method for compensating for frequency shifts during transmission of an RF control signal, the method comprising:
   receiving a request to enter a transmission mode from a user;
   generating a carrier signal having a frequency;
   measuring the frequency of the generated carrier signal;
   comparing the measured frequency of the generated carrier signal to a desired frequency;
   calculating and applying a correction to the carrier signal frequency when there is a difference between the measured frequency and the desired frequency and in response to a condition of data not being modulated on the generated carrier signal; and
   discontinuing the application of the correction to the carrier signal frequency in response to data being modulated on the generated carrier signal.

2. A method according to claim 1, wherein the carrier signal is generated by a voltage controlled oscillator.

3. A method according to claim 2, wherein the correction is applied to the voltage controlled oscillator.

4. A method according to claim 1, further comprising receiving a request from a user to enter a transmission mode via a user interface.

5. A method according to claim 1, further comprising storing carrier signal data in a memory module.

6. A method according to claim 5, wherein the carrier signal is stored in a volatile memory module.

7. A method according to claim 5, wherein the carrier signal is stored in a non-volatile memory module.

8. A method according to claim 1, further comprising providing a visual indication that a transmission mode was initiated.

9. A method according to claim 8, wherein the visual indication comprises a light emitting diode or a liquid crystal display.

10. An electronic control system for compensating for frequency shifting during transmission of a radio frequency control signal with a remote electronic device, the control system comprising:
    a transmitter for communicating with the remote electronic device;
    a voltage controlled oscillator circuit coupled to the transmitter, the voltage controlled oscillator circuit being configured to generate a control signal, the control signal having a carrier frequency; and
    a control circuit coupled to the voltage controlled oscillator circuit, the control circuit being configured to measure the carrier frequency of the control signal generated by the voltage controlled oscillator circuit, wherein the carrier frequency of the control signal is compared to a desired frequency of the remote electronic device and when a difference exists between the value of the carrier frequency and the desired frequency and in response to a condition of data not being modulated onto the control signal, the control circuit is configured to calculate and apply a correction to the carrier frequency of the control signal, and wherein the control circuit is configured to discontinue the application of the correction to the carrier frequency of the control signal in response to data being modulated on the carrier signal.

11. A system according to claim 10, further comprising a user interface configured to receive user input to facilitate communication with the remote electronic device.

12. A system according to claim 11, wherein the user interface comprises a voice-actuated input control circuit configured to receive a spoken input command from a user.

13. A system according to claim 11, wherein the user interface comprises one or more switches or buttons.

14. A system according to claim 13, further comprising a switch interface coupling the one or more switches or buttons to the control circuit, the switch interface being configured to indicate the closure status of the one or more switches or buttons.

15. A system according to claim 10, further comprising a memory module configured to store control signal data.

16. A system according to claim 15, wherein the memory module comprises a volatile memory.

17. A system according to claim 15, wherein the memory module comprises a non-volatile memory.

18. A system according to claim 10, further comprising a display element configured to provide a visual indicator that the transmitter has initiated communication with the remote electronic device.

19. A system according to claim 18, wherein the display element comprises a light emitting diode or a liquid crystal display.

* * * * *